(12) United States Patent
Hsiao et al.

(10) Patent No.: US 9,947,746 B2
(45) Date of Patent: Apr. 17, 2018

(54) BIPOLAR JUNCTION TRANSISTOR DEVICE AND METHOD FOR FABRICATING THE SAME

(71) Applicant: UNITED MICROELECTRONICS CORP., Hsinchu (TW)

(72) Inventors: Shih-Yin Hsiao, Taibao (TW); Kai-Kuen Chang, Keelung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 28 days.

(21) Appl. No.: 15/234,432

(22) Filed: Aug. 11, 2016

(65) Prior Publication Data

US 2018/0047809 A1    Feb. 15, 2018

(51) Int. Cl.
| | |
|---|---|
| H01L 29/08 | (2006.01) |
| H01L 29/10 | (2006.01) |
| H01L 29/73 | (2006.01) |
| H01L 21/266 | (2006.01) |
| H01L 29/732 | (2006.01) |

(52) U.S. Cl.
CPC ........ H01L 29/0804 (2013.01); H01L 21/266 (2013.01); H01L 29/1004 (2013.01); H01L 29/7322 (2013.01)

(58) Field of Classification Search
CPC ............. H01L 29/0804; H01L 29/1004; H01L 29/7322; H01L 21/266
See application file for complete search history.

(56) References Cited

U.S. PATENT DOCUMENTS

| | | | | |
|---|---|---|---|---|
| 2009/0166673 | A1* | 7/2009 | Benaissa | H01L 29/66325 257/141 |
| 2010/0133583 | A1* | 6/2010 | Mawatari | H01L 27/0259 257/173 |
| 2011/0248383 | A1 | 10/2011 | Ren et al. | |
| 2012/0032243 | A1* | 2/2012 | Kutsukake | H01L 27/11521 257/298 |
| 2016/0300830 | A1* | 10/2016 | Salcedo | H01L 27/0259 |

OTHER PUBLICATIONS

Tai et al. "U.S. Appl. No. 15/188,962", filed Jun. 21, 2016, USA.

* cited by examiner

*Primary Examiner* — Christine Enad
(74) *Attorney, Agent, or Firm* — WPAT, PC (57) ABSTRACT

A bipolar junction transistor (BJT) device includes a semiconductor substrate, a first doping region with a first conductivity, a second doping region with a second conductivity, a third doping region with the first conductivity, at least one stacked block and a conductive contact. The first doping region is formed in the semiconductor substrate. The second doping region is formed in the first doping region. The at least one stacked block is formed on and insulated from the second doping region. The third doping region is formed in the second doping region and disposed adjacent to the at least one stacked block. The conductive contact electrically connects the at least one stacked block with the third doping region.

17 Claims, 8 Drawing Sheets

BIPOLAR JUNCTION TRANSISTOR DEVICE AND METHOD FOR FABRICATING THE SAME

BACKGROUND

Technical Field

The disclosure relates in generally to a semiconductor device and the method for fabricating the same, and more particularly to a bipolar junction transistor (BJT) device and the method for fabricating the same.

Description of the Related Art

In the semiconductor industry, a BJT device is known and used as either an amplifying device or a switching device applied in a semiconductor integrated circuit (IC). A typical BJT device essentially comprises three doped active regions, an emitter region, a base region and a collector region. These regions form a first diode between the base region and the emitter region and a second diode between the base region and collector region.

It has been observed that each active region has an associated current, $I_e$, $I_b$ and $I_c$. Of these currents, with respect to a PNP-type device, $I_b$ is a minority carrier current involving the flow of electrons, while both $I_e$ and $I_c$ are majority carrier currents which pertain to the flow of holes. Similarly, in an NPN-type device, $I_b$ is a majority carrier current and both $I_e$ and $I_c$ are minority carrier currents. The total emitter current comprises the sum of the total number of electrons reaching the collector and the total number of electrons that flow out of the transistor through the base. This can be expressed in mathematical terms by the following equation:

$$I_e = I_c + I_b$$

Further, the current gain (beta$\beta$) relationship between $I_e$ and $I_c$, can be quantified by the following formula:

$$\beta = I_c/I_b$$

Thus, given these relationships, the extent of minority carrier flow directly relates to the value of the current gain, and it has been well known that the doped conductivity configuration of the BJT, such as the doping concentrations of these three active regions, may impact on the current gain's value. In other words, the current gain ($\beta$) of the BJT can be tuned by performing at least one additional ion implantation to adjust the implant dosage and energy of these three active regions. However, the additional ion implantation would adversely impact the performance of other devices involved in the semiconductor IC.

Therefore, there is a need of providing an improved BJT and the method for fabricating the same to obviate the drawbacks encountered from the prior art.

SUMMARY

One aspect of the present disclosure is to provide a bipolar junction transistor (BJT) device, wherein the BJT device includes a semiconductor substrate, a first doping region with a first conductivity, a second doping region with a second conductivity, a third doping region with the first conductivity, at least one stacked block and a conductive contact. The first doping region is formed in the semiconductor substrate. The second doping region is formed in the first doping region. The at least one stacked block is formed on and insulated from the second doping region. The third doping region is formed in the second doping region and disposed adjacent to the at least one stacked block. The conductive contact electrically connects the at least one stacked block with the third doping region.

Another aspect of the present disclosure is to provide a method for fabricating a BJT device, wherein the method includes steps as follows: A semiconductor substrate is provided and a first doping region with a first conductivity is then formed in the semiconductor substrate. Next, a second doping region with a second conductivity is formed in the first doping region. At least one stacked block is formed on the second doping region, wherein the at least one stacked block is insulated from the second doping region. A third doping region with the first conductivity is formed in the second doping region using the at least one stacked block as a mask. Subsequently, a conductive contact is formed to electrically connect the at least one stacked block with the third doping region.

In accordance with the aforementioned embodiments of the present disclosure, a BJT device and the method for fabricating the same are disclosed. At least one stacked block is formed on and insulated from a predetermined region of a semiconductor substrate on which an implantation process will be subsequently performed to form a doping region serving as either an emitter, a base or a collector of the BJT device using the at least one stacked block as a mask. And the doping region is then electrically connected to the at least one stacked block through a conductive contact.

Since the at least one stacked block is formed to partially cover the predetermined region, thus the dimension of the doping region serving as either the emitter, the base or the collector of the BJT device can be adjusted by varying the coverage area (or the floor area ratio) of the at least one stacked block which can be obtained by diving the total area of the predetermined region by the area upon which the at least one stacked block covered thereon. Such that, the resistance and the current gain ($\beta$) of the doping region serving as either the emitter, the base or the collector of the BJT device that are inversely proportional to the dimension of the doping region can be adjusted by varying the coverage area of the at least one stacked block without requiring any additional ion implantation.

In addition, the electrical connection is formed by the conductive contact to connect the doping region with the at least one stacked block, the voltage difference between the at least one stacked block and the doping region serving as either the emitter, the base or the collector of the BJT device may be equal to 0. In other words, the voltage applied on the predetermined region may not be changed during the operation, despite the variation in resistance of the doping region, The current gain ($\beta$) of the BJT device can be tuned without adversely impact the performance of other devices involved in the semiconductor IC applying the BJT device.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

The embodiments as illustrated below provide a BJT device and the method for fabricating the same. The present disclosure will now be described more specifically with reference to the following embodiments illustrating the structure and arrangements thereof. It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

FIGS. 1A to 1G are a serious of top views illustrating the processing structures for fabricating a BJT device 100 in accordance with one embodiment of the present disclosure; and FIGS. 2A to 2G are a serious of cross-sectional views respectively taken along taken along the section line S1 shown in FIGS. 1A to 1G. The method for fabricating the BJT device 100 includes steps as follows:

Firstly, a semiconductor substrate 101 is provided. In some embodiments of the present the semiconductor substrate 101 can be a silicon substrate, such as a silicon wafer. In the present embodiment, the semiconductor substrate 101 is a bulk semiconductor substrate made of poly-silicon. However, in some other embodiments, the semiconductor substrate 101 can further include other layer, such as insulating layers or semiconductor layers consisting of semiconductor material other than poly-silicon (not shown).

Figure 1A:
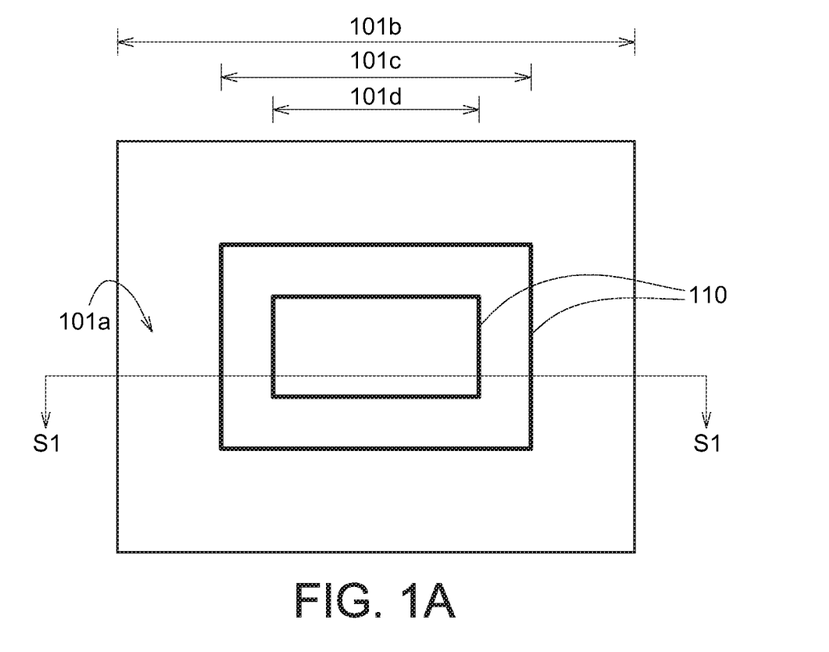
FIGS. 1A to 1G are a serious of top views illustrating the processing structures for fabricating a BJT device in accordance with one embodiment of the present disclosure.
Figure 1B:
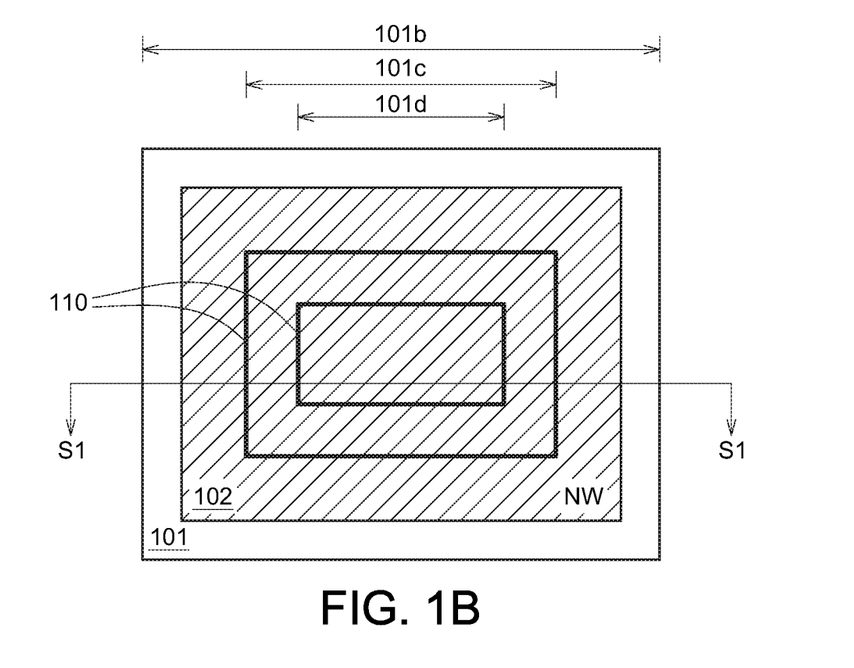
Figure 2A:
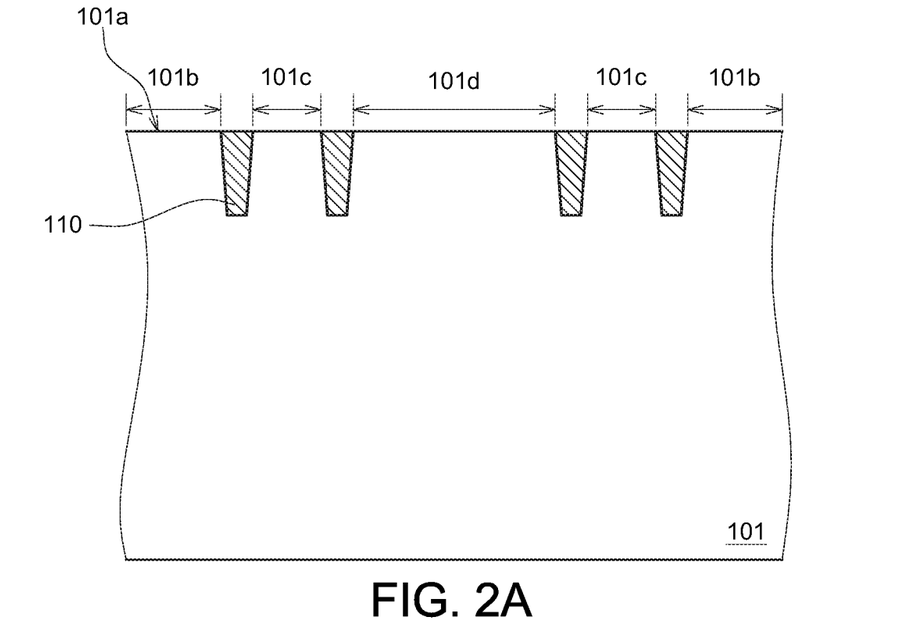
FIGS. 2A to 2G are a serious of cross-sectional views respectively taken along taken along the section line S1 shown in FIGS. 1A to G.
Figure 2B:
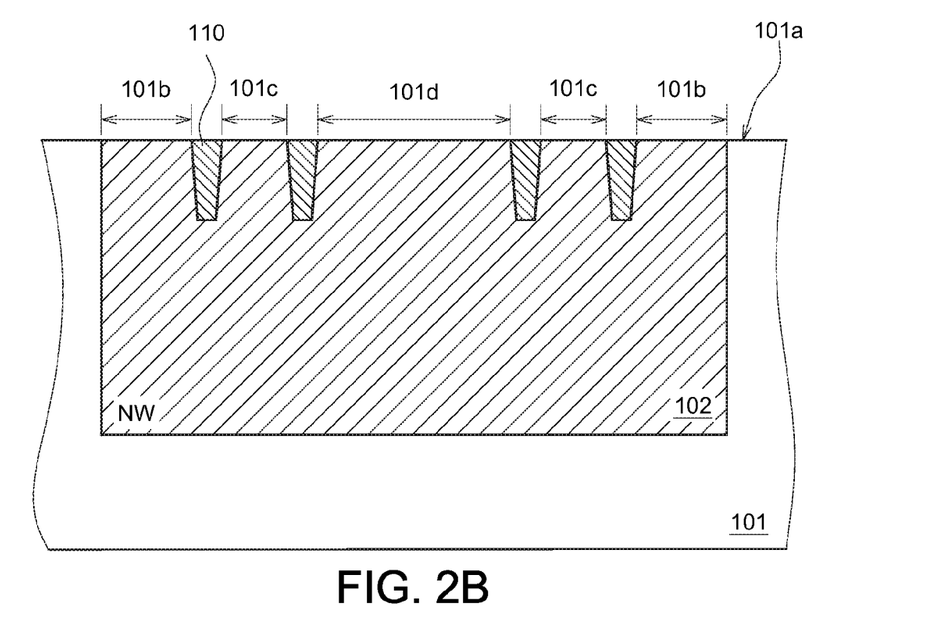

A plurality of isolation structure 110, such as shallow trench isolations (STIs), are then formed in the semiconductor substrate 101 to divide a surface 101a of the semiconductor substrate 101 at least into a first predetermined region 101b, a second predetermined region 101c and a third predetermined region 101d (see FIGS. 1A and 2A).

A first doping region 102 with a first conductivity is then formed in the semiconductor substrate 101. In some embodiments of the present disclosure, the forming of the first doping region 102 includes steps of performing an ion implantation on the surface 101a of the semiconductor substrate 101 involving the first predetermined region 101b, the second predetermined region 101c and third predetermined region 101d to drive a plurality of n-type dopants, such as ions containing phosphorus (P) or arsenic (As), into the semiconductor substrate 101, so as to form the first doping region 102 having an n-type conductivity (denoted as NW) extending downwards into the semiconductor substrate 101 from a surface 101a of the semiconductor substrate 101 (see FIGS. 1B and 2B).

In some other embodiments of the present disclosure, the first doping region 102 may be a portion of the semiconductor substrate 101 having the first-type conductivity. Although the first doping region 102 applied in the present embodiment has an n-type conductivity, persons skilled in the art can apparently appreciate that the first doping region 102, the structural configuration and its related process for fabricating the BJT device 100, in some other embodiments, can be alternatively applicable to a p-type conductivity.

Figure 1C:
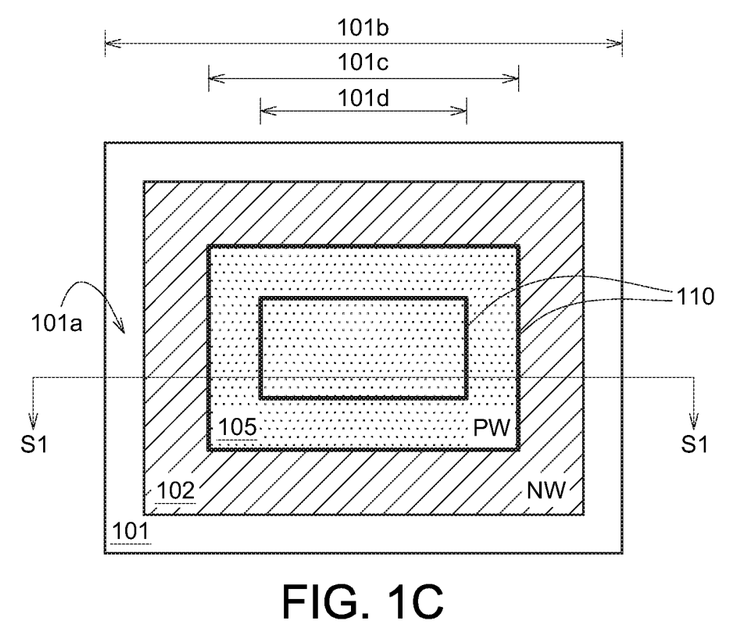
Figure 2C:
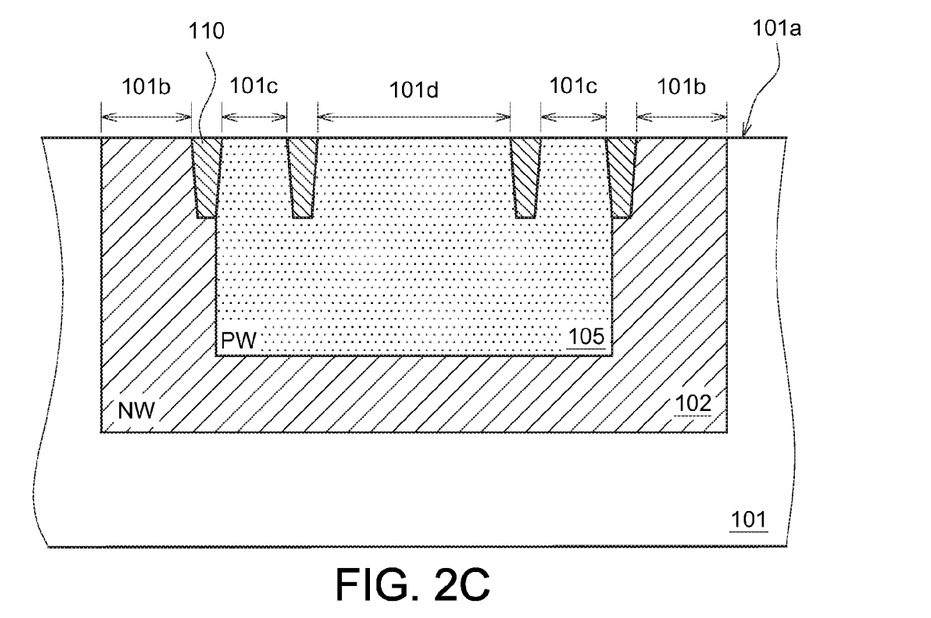

Next, another ion implantation is performed on the surface 101a of the semiconductor substrate 101 involving second predetermined region 101c and the third predetermined region 101d to drive a plurality of p-type dopants, such as ions containing boron (B) or aluminum (Al), into the second predetermined region 101c and the third predetermined region 101d, so as to form a second doping region 105 having a p-type conductivity (denoted as PW) in the first doping region 102 (second predetermined region 101c) extending downwards into the semiconductor substrate 101 from the surface 101a of the semiconductor substrate 101 (see FIGS. 1C and 2C). In the present embodiment, the second doping region 105 has a doping concentration substantially equal to that of the first doping region 102.

At plurality of stacked blocks 106 is then formed on the third predetermined region 101d, wherein the stacked blocks 106 are insulated from the second doping region 105. In some embodiment of the present disclosure, the forming of the stacked blocks 106 includes steps as follows:

A dielectric layer 107 and a conductive layer 108 are formed in sequence on the surface 101a of the semiconductor substrate 101 and covering on the second doping region 105. Wherein, the conductive layer 108 is electrically separated from the second doping region 105 by the dielectric layer 107 (see FIGS. 1D and 2D).

Figure 1D:
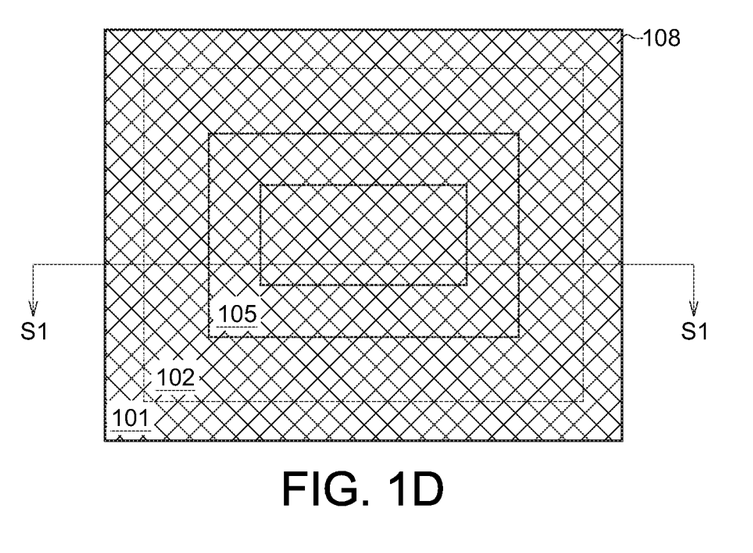
Figure 2D:
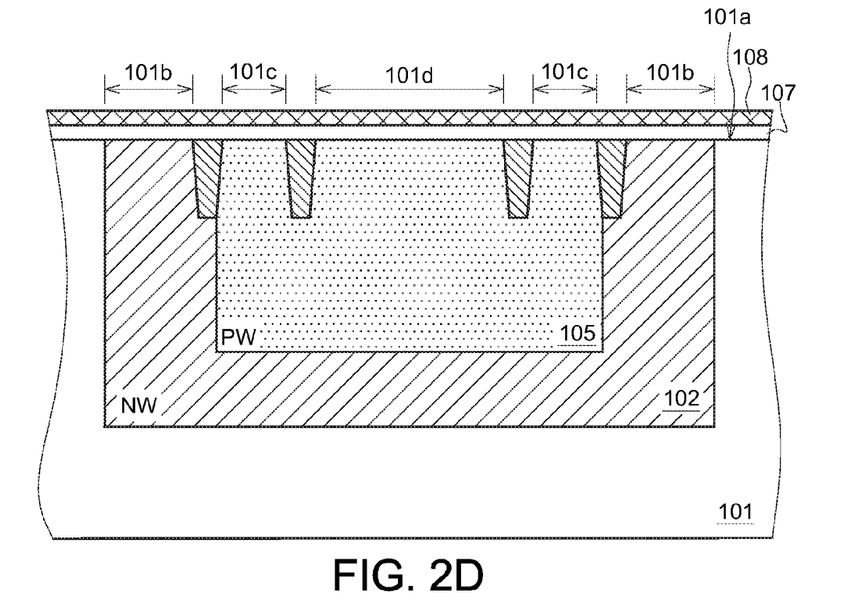

In some embodiments of the present disclosure, the dielectric layer 107 can be formed by a thermal oxidation process or a deposition process (not shown) performed on the surface 101a of the semiconductor substrate 101. The conductive layer 108 can be formed by a deposition process, such as a chemical vapor deposition (CVD), a low pressure chemical vapor deposition (LPCVD), a plasma-enhanced chemical vapor deposition (PECVD), a sub-atmosphere chemical vapor deposition (SACVD), an atomic layer deposition (ALD), a physical vapor deposition (PVD), and/or other appropriate processing techniques, performed on the dielectric layer 107.

In the present embodiment, the dielectric layer 107 is a silicon oxide layer and the conductive layer 108 is made of poly-silicon. In yet other embodiments, the conductive layer 108 is made of conductive material other than poly-silicon, for example metal (such as copper (Cu), aluminum (Al), tungsten (W), the alloys thereof or the like), silicide or the arbitrary combinations thereof.

Figure 1E:
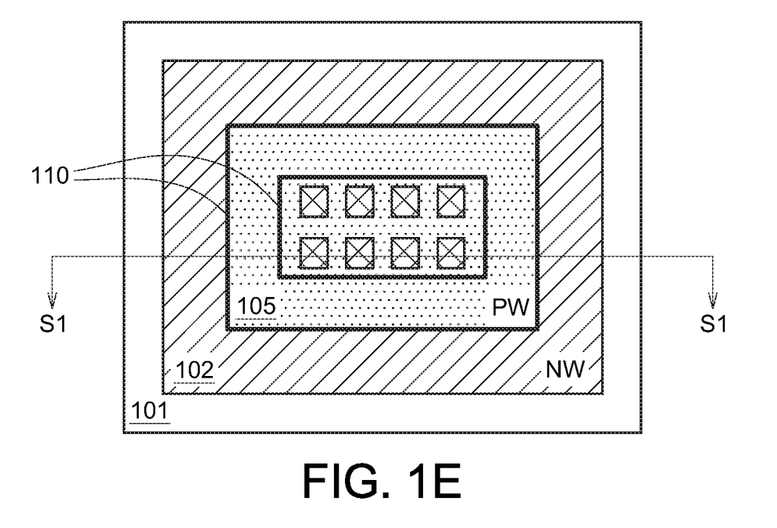
Figure 2E:
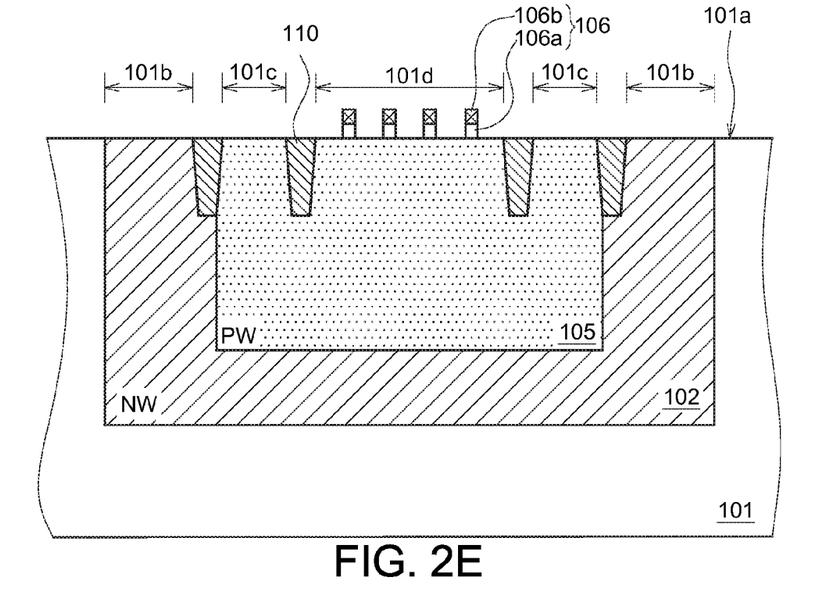

Thereafter, an etching process is performed to remove portions of the dielectric layer 107 and the conductive layer 108 to form a plurality of the stacked blocks 106 on the third predetermined region 101d involved in the second doping region 105 and expose a portion of the second doping region 105 (see FIGS. 1E and 2E). Each of the stacked blocks 106 has a dielectric layer 106a and a conductive layer 106b stacked on the surface 101a of the semiconductor 101 with in the second doping region 105, and the conductive layer 106b is insulated from the second doping region 105 by the dielectric layer 106a.

In some embodiment of the present disclosure, each of the stacked blocks 106 has a top-view profile parallel to the surface 101a of the semiconductor 101, and the top-view profile shapes as a regular polygon, an irregular polygon, a circle, an ellipse or an irregular shape. In the present embodiment, the top-view profile shapes as a rectangular.

Subsequently, yet another ion implantation is performed on the third predetermined region 101d using the stacked blocks 106 as a mask to drive a plurality of n-type dopants, such as P or As ions, downwards into the semiconductor substrate 101 from the surface 101a not covered by the stacked blocks 106, so as to form a third doping region 111 having the n-type conductivity (denoted as N+) in the second doping region 105. In short, the stacked blocks 106 partially covers the third predetermined region 101d involved in the second doping region 105; the third doping region 111 aligns the stacked blocks 106 and extends into the third predetermined region 101d not covered by the stacked blocks 106 (see FIGS. 1F and 2F).

Figure 1F:
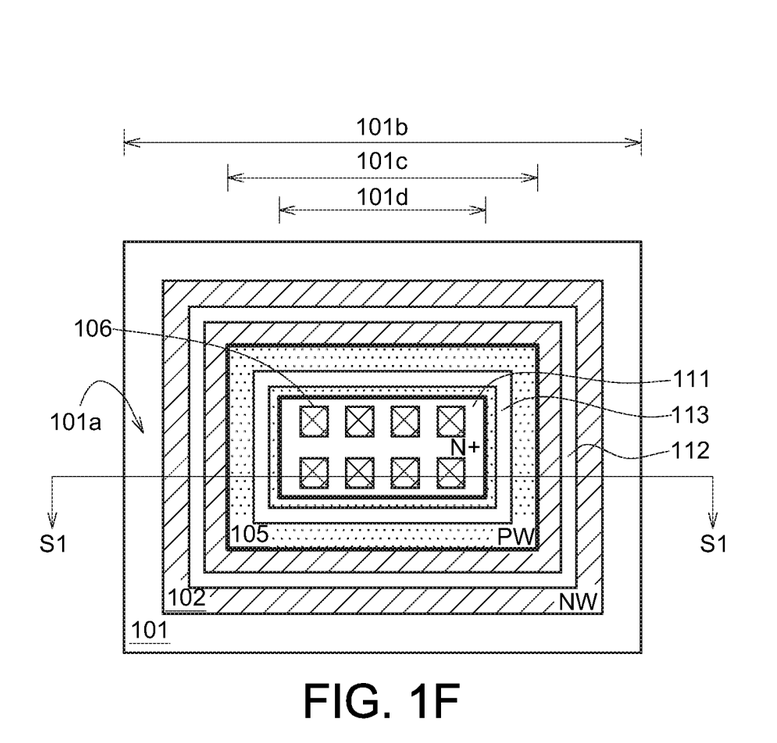
Figure 2F:
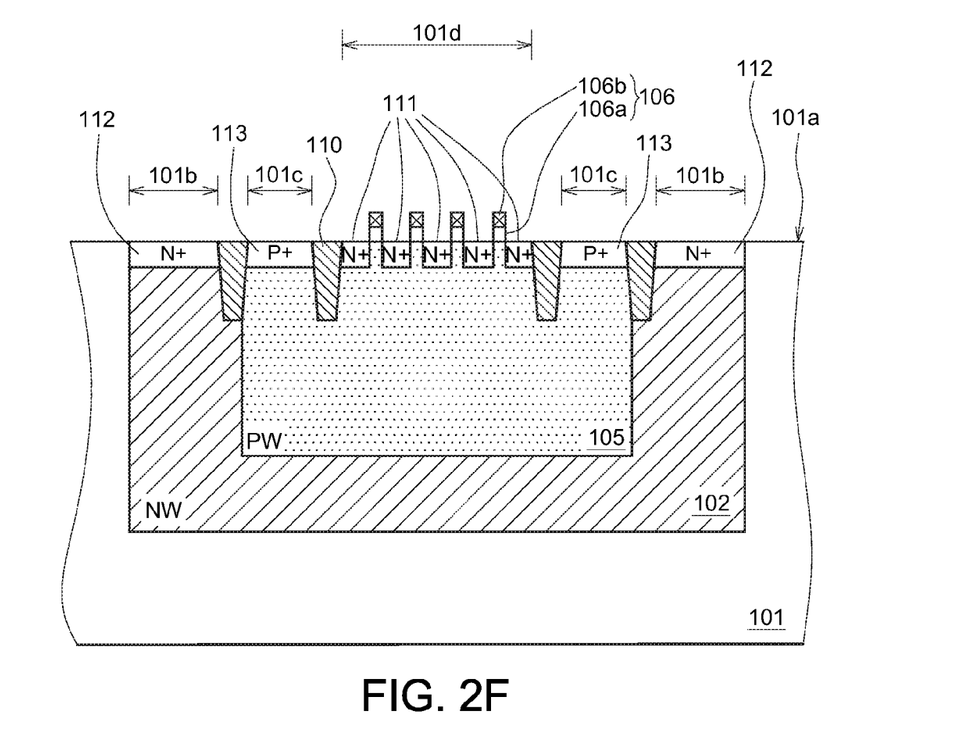

In some embodiments of the present disclosure, the third doping region 111 has a concentration substantially greater than that of the second doping region 105. The stacked blocks 106 are surrounded by the third doping region 111; and the stacked blocks 106 has a floor area ratio substantially ranging from 10% to 90%. The floor area ratio is the ratio of the total coverage area of the stacked blocks 106 to the area define by the third doping region 111 on which the stacked blocks 106 formed (the area of the third predetermined region 101d).

A plurality of n-type heavy doped regions 112 (also denoted as N+) having a concentration substantially greater than that of the first doping region 102 are formed in the portion of the first doping region 102 that is not overlapped with the second doping region 105; and a plurality of p-type heavy doped regions 113 (denoted as P+) having a concentration substantially greater than that of the second doping region 105 are formed in the portion of the second doping region 105 that is not overlapped with the third doping region 111 and the stacked blocks 106.

In some embodiments of the present disclosure, the process for forming the n-type heavy doped regions 112 may be identical to or different from the process for forming the third doping region 111. The ion implantation processes used for forming the n-type heavy doped regions 112 and the p-type heavy doped regions 113 may be performed either prior to or after the ion implantation for forming the third doping region 111.

Figure 1G:
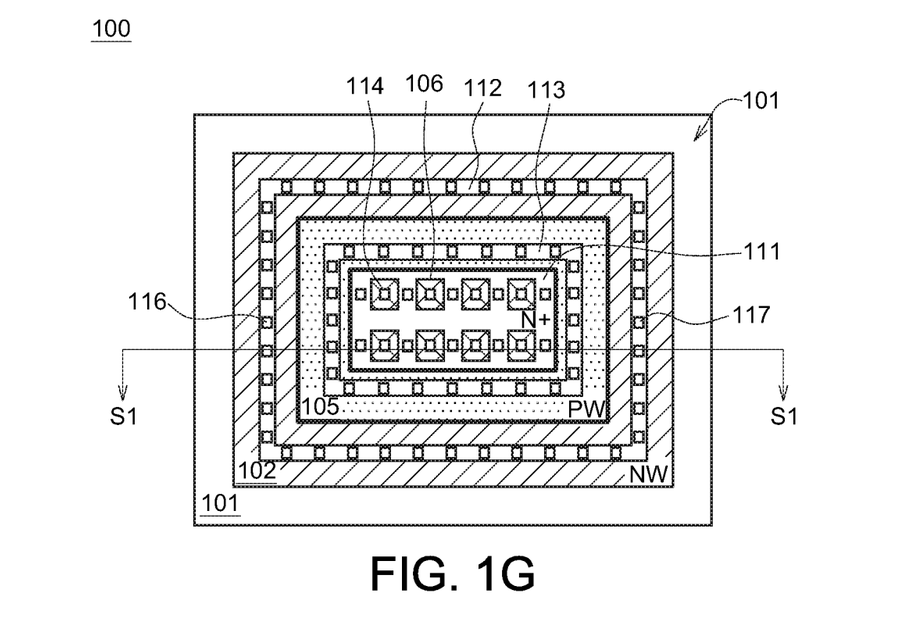
Figure 2G:
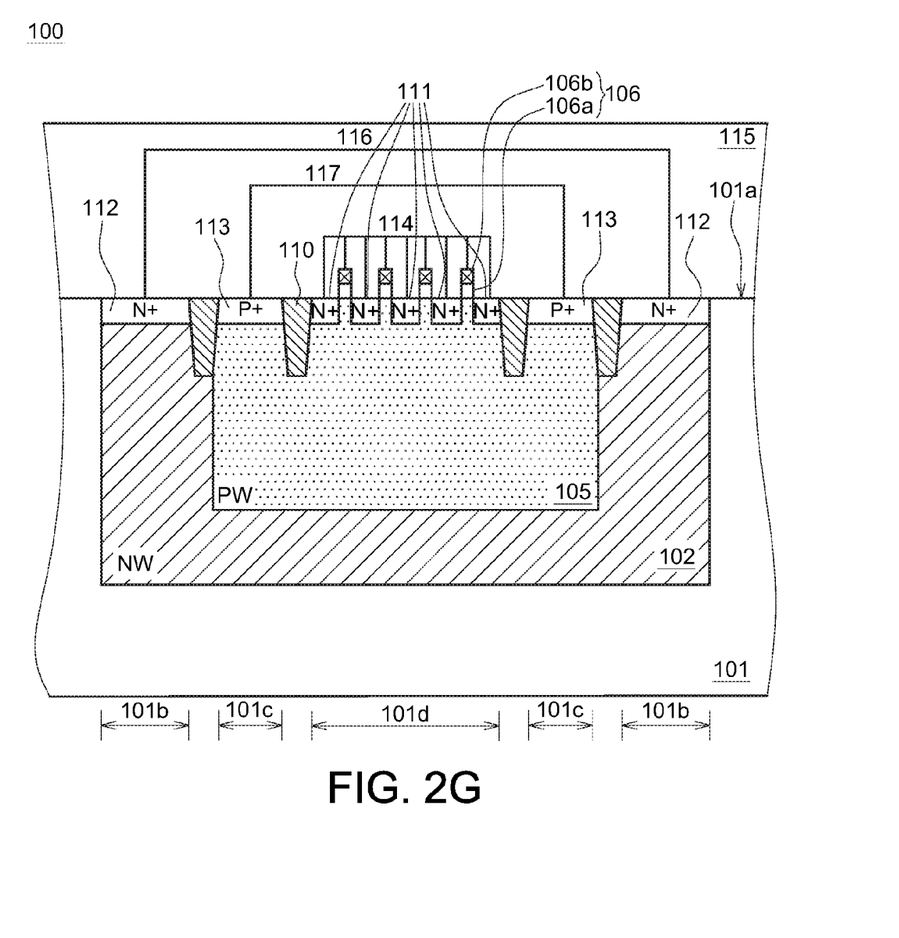

A conductive contact structure 114 is then formed to electrically connect the stacked blocks 106 with the third doping region 111, and after a series of back-end-of-line (BEOL) processes are performed, the process for forming the BJT device 100 as shown FIGS. 1G and 2G is accomplished. In the present embodiment, the conductive contact 114 can be the interconnection structure formed in an interlayer dielectric (ILD) layer 115 formed on the surface 101a of the semiconductor substrate 101 on which the first doping region 102, the second doping region 105, third doping region 111 and the stacked blocks 106 are formed.

In some embodiments of the present disclosure, a conductive contact structure 116 electrically connecting the n-type heavy doped regions 112 and a conductive contact structure 117 electrically connecting the p-type heavy doped regions 113 are also formed in the ILD layer 115 by the same metal interconnection process used to form the conductive contact structure 114.

Refer to FIGS. 1G and 2G again, the BJT device 100 includes a semiconductor substrate 101, a first doping region 102 with a first conductivity (n-type), a second doping region 105 with a second conductivity (p-type), a third doping region 111 with the first conductivity (n-type), at least one stacked block 106 and a conductive contact 114. The first doping region 102 is formed in the semiconductor substrate 101. The second doping region 105 is formed in the first doping region 102. The at least one stacked block 106 is formed on and insulated from the second doping region 105. The third doping region 111 is formed in the second doping region 105 and disposed adjacent to the at least one stacked block 106. The conductive contact 114 electrically connects the at least one stacked block 106 with the third doping region 111.

In the present embodiment, the first doping region 102, the second doping region 105 and the third doping region 111 may respectively serve as the collector, the base and the emitter of the BJT device 100. However, the arrangement of the doping regions may not be limited to this regards. In some other embodiments of the present disclosure, the emitter or the base of the BJT device 100 may be substituted by different doping regions.

The at least one stacked block 106 partially covers on the area defined by the third doping region 111 (the total area of the third predetermined region 101d). In some embodiments of the present disclosure, the at least one stacked block 106 has a floor area ratio substantially ranging from 10% to 90% obtained by diving the total area of the third predetermined region 101d by the area upon which the at least one stacked block covered thereon. The more floor area ratio of the at least one stacked block 106, the smaller dimension of the third doping region 111 that is proportional to the associate current of passing through the third doping region 111 (the base of the BJT device 100).

With reference to the aforementioned formula, the current gain (β) of the BJT device 100 can be tuned by adjusting the floor area ratio of the least one stacked block 106 without requiring an additional ion implantation process for adjusting the implant dosage and energy of the base. In addition, because the electrical connection 114 is formed to connect the third doping region 111 with the at least one stacked block 106, the voltage applied on the third doping region 111 (the base of the BJT device 100) may not be changed during the operation despite the variation in its current gain (β). Accordingly, the performance of the other devices of a semiconductor IC applying the BJT device 100 with tunable current gain (β) may not be adversely affected.

In accordance with the aforementioned embodiments of the present disclosure, a BJT device and the method for fabricating the same are disclosed. At least one stacked block is formed on and insulated from a predetermined region of a semiconductor substrate on which an implantation process will be subsequently performed to form a doping region serving as either an emitter, a base or a collector of the BJT device using the at least one stacked block as a mask. And the doping region is then electrically connected to the at least one stacked block through a conductive contact.

Since the at least one stacked block is formed to partially cover the predetermined region, thus the dimension of the doping region serving as either the emitter, the base or the collector of the BJT device can be adjusted by varying the coverage area (or the floor area ratio) of the at least one stacked block which can be obtained by diving the total area of the predetermined region by the area upon which the at least one stacked block covered thereon. Such that, the resistance and the current gain (β) of the doping region serving as either the emitter, the base or the collector of the BJT device that are inversely proportional to the dimension of the doping region can be adjusted by varying the coverage area of the at least one stacked block without requiring any additional ion implantation.

In addition, the electrical connection is formed by the conductive contact to connect the doping region with the at least one stacked block, the voltage difference between the at least one stacked block and the doping region serving as either the emitter, the base or the collector of the BJT device may be equal to 0. In other words, the voltage applied on the predetermined region may not be changed during the operation, despite the variation of resistance of the doping region, The current gain (β) of the BJT device can be tuned without adversely impact the performance of other devices involved in the semiconductor IC applying the BJT device.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A bipolar junction transistor (BJT) device comprising:
a substrate;
a first doping region with a first conductivity formed in the substrate;
a second doping region with a second conductivity formed in the first doping region;
at least one stacked block formed on and insulated from the second doping region;
a third doping region with the first conductivity formed in the second doping region and surrounding the at least one stacked block; and
a conductive contact, electrically connecting the at least one stacked block with the third doping region.

2. The BJT device according to claim 1, wherein the at least one stacked block comprises:
a dielectric layer formed on the second doping region; and
a conductive layer formed on the dielectric layer by which the conductive layer is electrically separated from the second doping region.

3. The BJT device according to claim 2, wherein the dielectric layer comprises silicon oxide; and the conductive layer is made of a conductive material selected from a group consisting of poly-silicon, metal, silicide and arbitrary combinations thereof.

4. The BJT device according to claim 1, wherein the conductive contact comprises a metal interconnection structure.

5. The BJT device according to claim 1, wherein the at least one stacked block partially covers a surface of the semiconductor substrate involved in the second doping region, and the third doping region extends downwards into the semiconductor substrate from a portion of the surface not covered by the at least one stacked block.

6. The BJT device according to claim 5, wherein the third doping region aligns to the at least one stacked block.

7. The BJT device according to claim 5, wherein the at least one stacked block has a floor area ratio substantially ranging from 10% to 90%.

8. The BJT device according to claim 5, wherein the at least one stacked block has a top-view profile parallel to the surface, and the top-view profile shapes as a regular polygon, an irregular polygon, a circle, an ellipse or an irregular shape.

9. The BJT device according to claim 5, wherein the BJT device comprises a plurality of stacked blocks disposed on the surface.

10. The BJT device according to claim 1, wherein the at least one stacked block and the third doping region have a voltage difference substantially equal to 0.

11. A method for fabricating a BJT device comprising:
providing a semiconductor substrate;
forming a first doping region with a first conductivity in the semiconductor substrate;
forming a second doping region with a second conductivity in the first doping region;
forming at least one stacked block on the second doping region, wherein the at least one stacked block is insulated from the second doping region;
forming a third doping region with the first conductivity in the second doping region using the at least one stacked block as a mask, so as to make the at least one stacked block surrounded by the third doping region; and
forming a conductive contact to electrically connect the at least one stacked block with the third doping region.

12. The method according to claim 11, wherein the process for forming the at least one stacked block comprises:
forming a dielectric layer on a surface of the second doping region;
forming a conductive layer on the dielectric layer; and
performing an etching process to remove portions of the dielectric layer and the conductive layer to expose a portion of the second doping region.

13. The method according to claim 12, wherein the dielectric layer comprises silicon oxide; and the conductive layer is made of a conductive material selected from a group consisting of poly-silicon, metal, silicide and arbitrary combinations thereof.

14. The method according to claim 12, wherein the at least one stacked block formed by the etching process partially covers on an area defined by the third doping region and has a floor area ratio substantially ranging from 10% to 90%.

15. The method according to claim 12, wherein the at least one stacked block resulted from the etching process makes has a top-view profile parallel to the surface, and the top-view profile shapes as a regular polygon, an irregular polygon, a circle, an ellipse or an irregular shape.

16. The method according to claim 12, wherein the etching process forms a plurality of stacked blocks disposed on the surface.

17. The method according to claim 11, wherein the process for forming the conductive contact comprises performing a metal interconnection process.

* * * * *